(12) United States Patent
Hofrichter et al.

(10) Patent No.: US 11,740,280 B2
(45) Date of Patent: Aug. 29, 2023

(54) ELECTRIC COMPONENT WITH FAIL SAFE ELEMENT

(71) Applicant: TDK Electronics AG, Munich (DE)

(72) Inventors: Alfred Hofrichter, Hartberg (AT); Volker Wischnat, Deutschlandsberg (AT); Johann Pichler, Breitenau am Hochlantsch (AT)

(73) Assignee: TDK Electronics AG, Munich (DE)

( * ) Notice: Subject to any disclaimer, the term of this patent is extended or adjusted under 35 U.S.C. 154(b) by 637 days.

(21) Appl. No.: 16/614,848

(22) PCT Filed: May 24, 2018

(86) PCT No.: PCT/EP2018/063629
§ 371 (c)(1),
(2) Date: Nov. 19, 2019

(87) PCT Pub. No.: WO2018/215587
PCT Pub. Date: Nov. 29, 2018

(65) Prior Publication Data
US 2020/0209305 A1   Jul. 2, 2020

(30) Foreign Application Priority Data

May 24, 2017   (DE) .......................... 102017111415.7

(51) Int. Cl.
| | |
|---|---|
| *G01R 31/28* | (2006.01) |
| *H01C 7/02* | (2006.01) |
| *H01C 7/04* | (2006.01) |
| *H02H 9/00* | (2006.01) |
| *H02H 9/02* | (2006.01) |

(52) U.S. Cl.
CPC ..... *G01R 31/2829* (2013.01); *G01R 31/2827* (2013.01); *H01C 7/02* (2013.01); *H01C 7/04* (2013.01); *H02H 9/001* (2013.01); *H02H 9/026* (2013.01)

(58) Field of Classification Search
CPC ........ H01C 7/02; H01C 7/04; G01R 31/2829; G01R 31/2827; H02H 9/001; H02H 9/026
See application file for complete search history.

(56) References Cited

U.S. PATENT DOCUMENTS

| | | | |
|---|---|---|---|
| 4,699,520 A  * | 10/1987 | Wallenfang | G01K 7/24 |
| | | | 374/E7.018 |
| 5,094,198 A | 3/1992 | Trotta et al. | |
| 5,939,839 A  * | 8/1999 | Robel | H05B 45/56 |
| | | | 315/289 |
| 6,157,528 A  * | 12/2000 | Anthony | H01C 7/028 |
| | | | 361/111 |

(Continued)

FOREIGN PATENT DOCUMENTS

| | | |
|---|---|---|
| CN | 1067763 A | 1/1993 |
| CN | 101251943 A | 8/2008 |

(Continued)

*Primary Examiner* — Kyung S Lee
(74) *Attorney, Agent, or Firm* — Slater Matsil, LLP (57) ABSTRACT

An electric component with a fail safe element is disclosed. In an embodiment a component includes a functional element and a fail safe element electrically interconnected therewith, wherein the fail safe element is configured to ensure a minimum resistance or a minimum conductivity of the component in the event of a failure of the functional element.

20 Claims, 7 Drawing Sheets

(56) References Cited

U.S. PATENT DOCUMENTS

| | | | |
|---|---|---|---|
| 9,230,719 B2* | 1/2016 | Feichtinger | H01C 7/008 |
| 10,418,158 B1* | 9/2019 | Chen | C08L 51/06 |
| 2006/0176675 A1 | 8/2006 | Bourns et al. | |
| 2009/0027821 A1 | 1/2009 | Colby et al. | |
| 2010/0194522 A1* | 8/2010 | Janning | H01C 7/06 |
| | | | 338/22 R |

FOREIGN PATENT DOCUMENTS

| | | |
|---|---|---|
| CN | 101354937 A | 1/2009 |
| CN | 101694934 A | 4/2010 |
| CN | 202602242 U | 12/2012 |
| CN | 105023676 A | 11/2015 |
| DE | 4120005 A1 | 12/1992 |
| DE | 69207472 T2 | 5/1996 |
| DE | 20219088 U1 | 5/2003 |
| DE | 10249411 B3 | 5/2004 |
| DE | 19728763 B4 | 10/2007 |
| DE | 102009010214 A1 | 9/2010 |
| EP | 0203350 A2 | 12/1986 |
| EP | 0549060 A2 | 6/1993 |
| EP | 0836201 A2 | 4/1998 |
| JP | S4414201 Y | 6/1969 |
| JP | S49031265 | 3/1974 |
| JP | S51032743 | 9/1974 |
| JP | S50109778 U | 8/1975 |
| JP | S6051918 A | 3/1985 |
| JP | S62248202 A | 10/1987 |
| JP | S6368245 A | 3/1988 |
| JP | S63154534 A | 6/1988 |
| JP | H0275704 A | 3/1990 |
| JP | H03122502 A | 5/1991 |
| JP | H03209705 A | 9/1991 |
| JP | H03122502 U | 12/1991 |
| JP | H04359403 A | 12/1992 |
| JP | H10275711 A | 10/1998 |
| JP | 2004072961 A | 3/2004 |
| JP | 2015211218 A | 11/2015 |
| KR | 101451554 B1 | 10/2014 |

* cited by examiner

ELECTRIC COMPONENT WITH FAIL SAFE ELEMENT

This patent application is a national phase filing under section 371 of PCT/EP2018/063629, filed May 24, 2018, which claims the priority of German patent application 102017111415.7, filed May 24, 2017, each of which is incorporated herein by reference in its entirety.

TECHNICAL FIELD

The present invention relates to an electric component comprising a functional element and a fail safe element. The functional element is for example a PTC thermistor (positive temperature coefficient element) or an NTC thermistor (negative temperature coefficient element). The fail safe element is configured to maintain a basic functionality in the event of a failure of the electric functional element.

BACKGROUND

Electric components such as, e.g., ceramic components, protective components or heating elements can fail for various reasons. By way of example, a failure can occur in the event of mechanical loading, overcurrent or material fatigue. This can lead to a short circuit or to a contact separation ("open") of the component which in turn, depending on the use of the component, can lead to functional failure and, under certain circumstances, to safety-relevant disturbances. These disturbances must be brought under control if appropriate by means of complex technical solutions, for example monitoring systems or relays.

SUMMARY OF THE INVENTION

Embodiments provide an electric component having improved failure properties.

In accordance with a first embodiment of the present invention, an electric component comprising a functional element and a fail safe element electrically interconnected therewith is specified. The fail safe element ensures a minimum resistance and/or a minimum conductivity of the component in the event of a failure of the functional element. Consequently, the fail safe element ensures a basic functionality of the component in the event of failure of the functional element. By way of example, it is thereby possible for a safety-relevant disturbance or a complete functional failure to be avoided or at least delayed or moderated.

The functional element is a PTC thermistor or an NTC thermistor, for example. The functional element comprises a ceramic material, for example. The functional element takes the form of a disk, for example. The functional element can also take a different form, for example the form of a parallelepiped or of a cylinder. The functional element can have a hole for securing or electrical contacting.

The functional element or the entire component can be embodied as a temperature sensor or a temperature regulator. The functional element or the entire component can also be configured for limiting an inrush current (ICL component, standing for Inrush Current Limiter). It can also be embodied as a surge arrestor.

In the event of a failure of the functional element, there is no longer an ohmic contact via the functional element, for example, with the result that the resistance of the component without the fail safe element would be "infinite" or very high. This type of failure can also be referred to as contact separation or "open" and occurs for example in the event of a mechanical fracture of the functional element or upon detachment of electrical contacts. In specific applications, however, a minimum conductivity and a minimum current via the component may be required, for example for design- or application-dictated reasons. The fail safe element can ensure the minimum conductivity.

A failure of the functional element can also occur as a short circuit. In this case, the functional element provides no or only a low resistance, with the result that a high current flow via the functional element can occur. In order to avoid damage resulting from the high current flow, the fail safe element in this case can provide a minimum resistance.

In one embodiment, the fail safe element is interconnected in parallel with the functional element. In this case, the fail safe element can provide a minimum conductivity in the case of a contact separation ("open") of the functional element.

In an alternative embodiment, the fail safe element is interconnected in series with the functional element. In this case, the fail safe element can provide a minimum resistance in the case of a short circuit of the functional element.

A combination of the two embodiments can also be present. By way of example a functional element is interconnected in parallel with a first fail safe element and interconnected in series with a second fail safe element. The first fail safe element can provide a minimum conductivity and the second fail safe element can provide a minimum resistance.

It is advantageous if the fail safe element is less susceptible to failure than the functional element. Moreover, it is advantageous if the fail safe element has a simple and cost-effective design.

In one embodiment, the fail safe element is embodied as a wire section. The resistance of the fail safe element is then defined by suitable selection of the material, the length and the cross section of the wire. As an alternative thereto, the fail safe element is embodied as an ohmic resistance component. By way of example, the fail safe element comprises a ceramic material. The fail safe element can also be embodied as a suitably dimensioned PTC element.

The fail safe element has for example a largely temperature-independent resistance. This means that the resistance is approximately constant at least in a temperature range under consideration, for example of from −50° C. to 150° C. Approximately constant means, for example, that the resistance in this temperature range deviates from the value at 25° C. by a maximum of 20%, in particular by a maximum of 5%. The relevant temperature range can be dependent on the field of application. By way of example, temperature ranges of from −25° C. to 125° C. or from −70° C. to 250° C./300° C. can also be considered.

The functional element has for example a temperature-dependent resistance, in particular greatly temperature-dependent resistance. By way of example, the resistance increases greatly (PTC element) or decreases greatly (NTC element) as the temperature rises in a specific temperature range. A great temperature dependence means, for example, that the resistance in the temperature range under consideration deviates from the value at 25° C. by at least 100% at at least one point, in a range or starting from a specific temperature.

The fail safe element can also have a temperature-dependent resistance. By way of example, the fail safe element is embodied as a PTC thermistor.

The resistance of the fail safe element can be optimized with regard to the desired properties of the component. By way of example, the fail safe element can be dimensioned in such a way that during normal operation, i.e., without failure of the functional element, it contributes only little to the total resistance or to the total conductivity of the component.

By way of example, in the case of a parallel interconnection at a selected temperature, for example at 25° C., the resistance of the fail safe element can be chosen to be greater than or equal to the resistance of the functional element. By way of example, the resistance of the fail safe element is significantly greater than the resistance of the functional element. By way of example, at 25° C. the resistance of the fail safe element is at least double the magnitude of the resistance of the functional element. The resistance of the fail safe element can also be greater than the resistance of the functional element by at least one order of magnitude. The resistance can also be equal or greater in the entire relevant temperature range, for example of from −50° C. to 150° C.

By way of example, in the case of a serial interconnection, the resistance of the fail safe element at a selected temperature, for example at 25° C., is significantly less than the resistance of the functional element. By way of example, at 25° C. the resistance of the fail safe element is at most half the magnitude of the resistance of the functional element. The resistance of the fail safe element can also be less than the resistance of the functional element by at least one order of magnitude. The resistance can also be equal or less in the entire relevant temperature range, for example of from −50° C. to 150° C.

The fail safe element can also be dimensioned in such a way that at a selected temperature the total resistance of the component deviates as little as possible from the resistance of the functional element. By way of example, the deviation is less than 10% at a temperature of greater than 0° C.

In addition thereto, the fail safe element can be dimensioned in such a way that it has positive effects on the entire electrical characteristic even without failure of the functional element.

By way of example, the resistance at low temperature can be reduced by means of a correspondingly dimensioned fail safe element. In this way, it is possible to reduce the current loss during switch-on processes in the low temperature range and thus to reduce the power loss. By way of example, the fail safe element is interconnected in parallel with an NTC element. By way of example, at a temperature of less than or equal to −40° C., the resistance of the fail safe element is less than or equal to the resistance of the functional element. The relevant temperature can be dependent on the field of application. A corresponding dimensioning can be advantageous in the case of serial interconnection as well.

In one embodiment, the functional element is embodied in the form of a disk. The functional element comprises a ceramic, for example. By way of example, leads in the form of wires are provided for the purpose of electrical contacting. The leads can extend parallel to one another. The leads are soldered to the functional element, for example. The functional element with leads is suitable for circuit board mounting, for example.

By way of example, in the case of parallel interconnection, the fail safe element is embodied as a suitably dimensioned piece of wire. In particular, the fail safe element can be embodied as a wire section that connects the leads directly to one another and thus produces a wire bridge between the leads. As an alternative thereto, the fail safe element can also be arranged in the form of an ohmic component in a connection of the leads. The fail safe element can also be embodied as a suitably dimensioned PTC element.

In the case of serial interconnection, the fail safe element is embodied for example as a wire that forms at least one portion of a contacting facility. By way of example, a wire section is arranged in a lead or completely forms a lead. In this case, the resistivity of the wire section differs for example from the resistivity of the lead. In the case of completely forming one lead, the resistivity of the wire section differs for example from the resistivity of the other lead.

In one embodiment, the functional element and/or the entire component are/is embodied for surface mounting. The fail safe element is arranged for example at that surface of the functional element which faces the carrier in the case of surface mounting. By way of example, the fail safe element is embodied in the form of a plate arranged between external contacts of the functional element and the carrier.

In one embodiment, the fail safe element is additionally embodied as a carrier and/or a housing part for the functional element and/or for leads to the functional element. By way of example, the fail safe element is embodied in the form of a rod onto which the functional element is pushed. In the case of a housing or housing part, the functional element is arranged for example within the fail safe element. Consequently, the housing or housing part can also perform a fail safe function besides its pure housing function.

In addition to ensuring a minimum resistance or a minimum conductivity, the fail safe element can also be configured for indicating a failure of the functional element and/or for initiating a fault mode. For this purpose, by way of example, the total resistance of the component is measured. Depending on interconnection and type of failure, a failure can for example be recognized by the fact that the total resistance corresponds to the resistance of the fail safe element.

The component can also comprise a plurality of functional elements. By way of example, the component comprises a fail safe element interconnected in parallel or in series with a plurality of functional elements. In this case, the fail safe element can ensure a minimum current or a minimum resistance in the event of failure of one or more of the functional elements.

A plurality of fail safe elements can also be present, each of which is connected in parallel or in series with one or more functional elements. By way of example, at least one or exactly one fail safe element is assigned to each functional element. Here, too, given suitable dimensioning of the fail safe elements, by measuring the total resistance, it is possible to recognize that a functional element has failed. Given corresponding dimensioning, it is also possible to recognize which of the functional elements has failed.

In accordance with a further embodiment of the present invention, a method for producing the component described above is specified. In this case, a functional element is provided. A temperature or a temperature range is defined for which the fail safe element is intended to have a specific resistance. By way of example, a temperature range is defined in which the functional element is particularly prone to failure. A fail safe element is then provided, the resistance of which assumes a chosen value at the defined temperature, for example at 25° C. or at a low temperature as described above.

In accordance with a further embodiment of the present invention, a component arrangement comprising at least two of the components described above is specified. The component arrangement can also be regarded as a component comprising a plurality of functional elements and fail safe elements.

In accordance with a further embodiment of the present invention, a method for detecting a failure of a functional element in the component described above is specified. In this case, the total resistance of the component is measured. The total resistance is compared with the calculated total resistance in the case of failure of the functional element. If the total resistance of the component corresponds to the calculated total resistance in the case of failure of the functional element, a failure is indicated. As an alternative or in addition thereto, a fault mode is initiated.

A plurality of embodiments of an invention is described in the present disclosure. All properties disclosed with regard to the component, the component arrangement or one of the methods are also correspondingly disclosed with regard to the other embodiment, even if the respective property is not explicitly mentioned in the context of the other embodiment.

Furthermore, the description of the subjects specified here is not restricted to the individual specific embodiments. Rather, the features of the individual embodiments—insofar as technically practical—can be combined with one another.

The subjects described here are explained in greater detail below on the basis of schematic exemplary embodiments.

DETAILED DESCRIPTION OF ILLUSTRATIVE EMBODIMENTS

Preferably, in the following figures, identical reference signs refer to functionally or structurally corresponding parts of the various embodiments.

Figure 1:
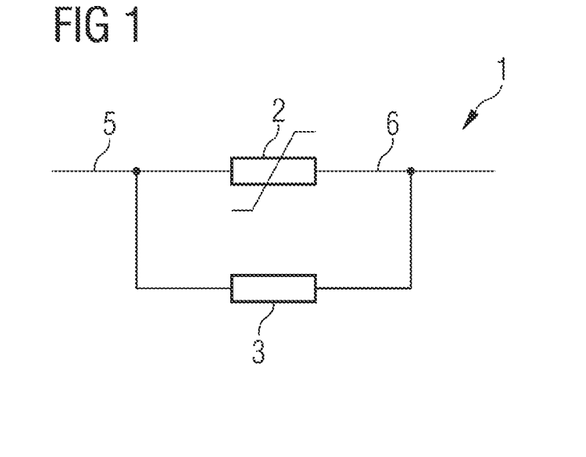
FIG. 1 shows one embodiment of a component in a schematic circuit diagram.

FIG. 1 shows a schematic circuit diagram of an electric component 1 comprising a functional element 2 and a fail safe element 3. The functional element 2 is a ceramic element, for example. This can be a multilayer component.

The functional element 2 has a greatly temperature-dependent resistance, for example. The functional element 2 can be embodied as an NTC thermistor (NTC component). The functional element 2 or the entire component 1 can be configured for limiting an inrush current (ICL component). The functional element 2 can also be embodied as a varistor. The functional element 2 or the entire component 1 can also be embodied as a surge arrestor.

Alternatively, the functional element 2 can also be embodied as a PTC thermistor (PTC element). By way of example, the functional element 2 or the entire component 1 serves as a temperature sensor or as a temperature regulator, in particular as a heating element.

In order to maintain a minimum current in the case of a contact separation, the component 1 comprises a fail safe element 3 interconnected in parallel with the functional element 2. In particular, the fail safe element 3 bridges the functional element 2 in the case of a contact separation. The fail safe element 3 has a resistance such that in normal operation the functioning of the functional element 2 is not impaired or is impaired only to a small extent. In particular, the fail safe element 3 fulfils the function of a high-resistance conductor and can be embodied for example as a suitably dimensioned piece of wire or an ohmic resistor. The fail safe element 3 can also be embodied as a suitably dimensioned PTC thermistor.

The fail safe element 3 produces a bridging between electrical contacting facilities 5, 6 of the functional element 2. The contacting facilities 5, 6 can be for example leads or external contacts of the functional element 2.

The total resistance $R_{tot}$ of the component 1 results from the resistance $R_F$ of the functional element 2 and the resistance $R_S$ of the fail safe element 3 by way of $1/R_{tot}=1/R_F+1/R_S$.

The magnitude of the resistance $R_S$ of the fail safe element 3 at 25° C., for example, is significantly greater than the resistance $R_F$ of the functional element 2, with the result that the resistance $R_{tot}$ of the entire component 1 at normal temperature is close to the resistance of the functional element 2. By way of example, a maximum deviation of 10%, at 25° C., for example, is obtained.

In the case of parallel interconnection, the deviation between the total resistance of the component 1 and the resistance of the functional element 2 is all the smaller, the higher the resistance of the fail safe element 3.

Moreover, the fail safe element 3 can be chosen such that at low temperature its resistance $R_S$ is less than or equal to the resistance of the functional element 2. By way of example, a low temperature is present at less than or equal to −40° C.; by way of example, a range of from −55° C. to −40° C. is considered here. A range of less than or equal to −25° C. can also be considered as low temperature, in particular a range of from −55° C. to −25° C.

In this way, it is possible to set the maximum resistance of the component 1 over the selected temperature range. In the case of parallel interconnection, the maximum resistance of the component 1 is all the lower, the lower the resistance of the fail safe element 2.

Consequently, the total resistance of the component 1 at low temperatures is less than the resistance of only the functional element 2, which results in a lower power loss. The characteristic curve can thereby be "linearized" at cold temperatures. Consequently, in addition to its fail safe function, the fail safe element 3 can also improve the properties of the component 1 or of the functional element 2 during normal operation.

In addition to the fail safe function, the fail safe element 3 can also provide an alarm signal for failure or for damage of the functional element 2 and/or initiate a fault mode for the component 1 or a superordinate system. For this purpose, by way of example, the total resistance of the component 1 is determined. If the total resistance corresponds to the resistance of the fail safe element 3, this can be interpreted as a signal for the failure of the functional element 2.

Figure 2:
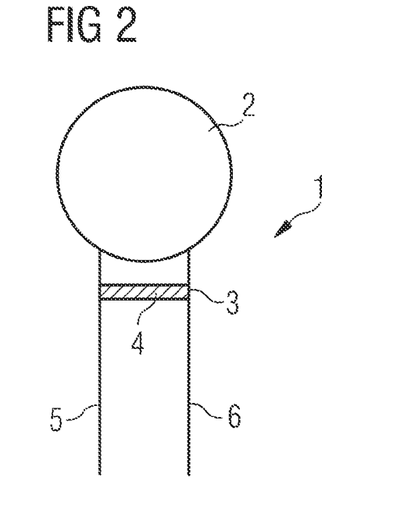
FIG. 2 shows one embodiment of a component in accordance with FIG. 1 in a lateral view.

FIG. 2 shows one embodiment of a component 1 in accordance with FIG. 1 in which a fail safe element 3 is interconnected in parallel with a functional element 2. The component 1 serves for inrush current limiting, for example.

The functional element 2 is a disk-type NTC thermistor, which for example comprises a sintered metal oxide and is provided with an outer metallization. The functional element 2 is electrically contacted via contacting facilities 5, 6 in the form of leads. The contacting facilities 5, 6 are embodied as wires which extend parallel to one another and for example also mechanically carry the functional element 2.

The fail safe element 3 is embodied as wire 4, in particular as a wire bridge. The fail safe element 3 electrically connects the contacting facilities 5, 6 and bridges the functional element 2 in the case of a failure as a result of contact separation. The fail safe element 3 is connected to the contacting facilities 5, 6 by soldering or welding, for example.

In the present case, the fail safe element 3 is formed only by the wire bridge. In an alternative embodiment, the fail safe element 3 can comprise a resistance component that provides an ohmic resistance. The resistance component is connected to the contacting facilities 5, 6 via connection wires, for example. The resistance component comprises a ceramic main body, for example.

The fail safe element 3 is realized together with the functional element 2 in a component 1. In particular, only a slight modification of a known component without a fail safe element 3, i.e., of a component comprising only the functional element 2 and the contacting facilities 5, 6, may be necessary. Consequently, a known component, in a cost-effective manner, can be provided with a fail safe element 3 and be mounted as usual.

Figure 3A:
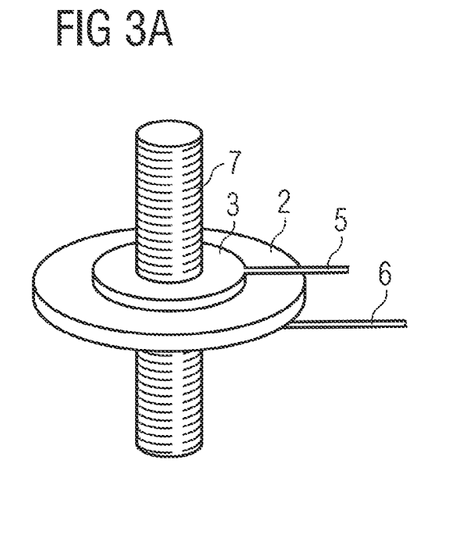
FIG. 3A shows a further embodiment of a component in accordance with FIG. 1 in a perspective partial view.
Figure 3B:
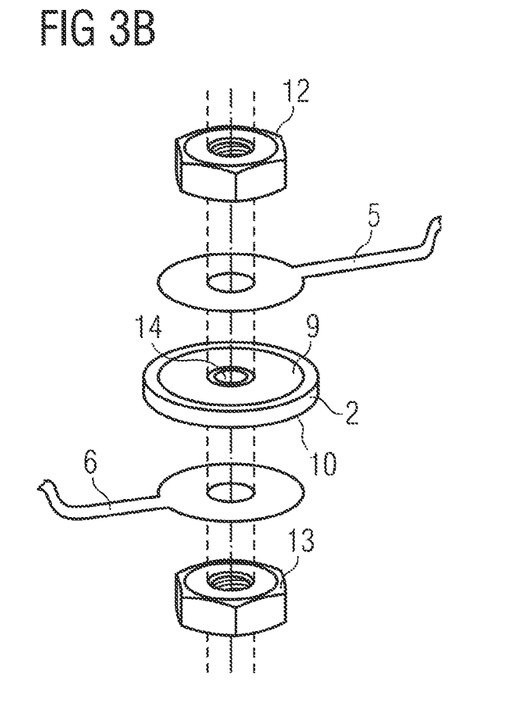
FIG. 3B shows parts of the embodiment of the component in accordance with FIG. 3A in a detailed exploded illustration.

FIGS. 3A and 3B show a further embodiment of a component 1 in accordance with FIG. 1 in which a fail safe element 3 is interconnected in parallel with a functional element 2. The component 1 is embodied for example as a ceramic inrush current limiter. FIG. 3A shows the functional element 2, the fail safe element 3 and the contacting facilities 5, 6 schematically; FIG. 3B shows the contacting facility of the functional element 2 in detail.

The functional element 2 is embodied in the form of a disk having a hole 14. The functional element 2 can also take a different form. On both sides, the functional element 2 has external contacts 9, 10 for electrical contacting. The external contacts 9, 10 are embodied as metallizations, for example.

The fail safe element 3 is embodied as a carrier 7 for the functional element 2 and/or for the contacting facilities 5, 6. The fail safe element 3 comprises for example a high-resistance conductor, such as, e.g., conductive plastic or a metal having a suitable resistivity. By way of example, steel is involved.

In the present case, the fail safe element 3 is embodied in the form of a rod, in particular a threaded rod, to which the functional element 2 is secured. The functional element 2 is for example pushed onto the rod. The fail safe element 3 can also take a different form.

The contacting facilities 5, 6 are arranged on both sides of the functional element 2, for example, and are carried by the fail safe element 3. By way of example, the contacting facilities 5, 6 comprise disk-shaped contact elements that are pushed onto the fail safe element 3. By way of example, copper contacts are involved. The contacting facilities 5, 6 can be embodied in particular in the form of cable lugs.

The contacting facilities 5, 6 and/or the functional element 2 can be secured to the fail safe element 3 by securing elements 12, 13. By way of example, the securing elements 12, 13 are embodied as nuts and screwed onto the fail safe element 3. The securing elements 12, 13 can also produce an electrical connection between the contacting facilities 5, 6 and the fail safe element 3. The contacting facilities 5, 6 can also be fixedly connected to the functional element 2, for example soldered to the functional element 2.

The contacting facilities 5, 6 are electrically conductively connected to the fail safe element 3, such that the fail safe element 3 produces a bridging in the event of a failure of the functional element 2 as a result of contact separation.

As an alternative thereto, the fail safe element 3 can also be embodied as a housing for the functional element 2 or as a housing part. In this case, the functional element 2 is embodied for example as a disk without a hole. The housing or housing part forms for example a protection of the functional element 2 from the outside. The housing or housing part can completely or partly enclose the functional element 2. The housing or housing part can be directly connected to the functional element 2. Alternatively, the housing or housing part is not directly connected to the functional element 2.

The fail safe element 3 can additionally be provided, for example coated, with an insulator, such as, e.g., lacquer, plastic, enamel or a glazing, on its exterior. Electrical flashovers or leakage currents can thus be avoided for safety reasons. Furthermore, corrosion can be avoided in order to ensure the fail safe function.

Furthermore, the fail safe element 3 can also be realized as an alternative securing possibility for components such as, e.g., PTC, NTC or ICL disks.

Figure 4:
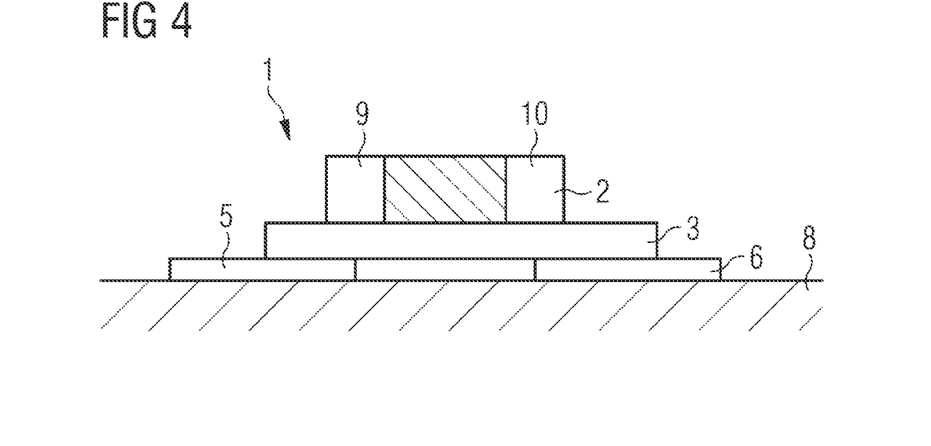
FIG. 4 shows a further embodiment of a component in accordance with FIG. 1 in a lateral view.

FIG. 4 shows a further embodiment of a component 1 in accordance with FIG. 1 in which the functional element 2 is configured for SMD (standing for surface mountable device) mounting.

The functional element 2 is configured for arrangement on a carrier 8, for example a circuit board. Contacting facilities 5, 6, for example in the form of soldering pads are arranged on the carrier 8. The fail safe element 3 is arranged on the contacting facilities 5, 6 and electrically connects the contacting facilities 5, 6. The functional element 2 is arranged on the fail safe element 3.

By way of example, the fail safe element 3 is soldered to the functional element 2 and produces a high-resistance connection between external contacts 9, 10 of the functional element 2. By way of example, the fail safe element 3 is embodied as a metallic resistance bridge, e.g., in the form of a plate, or as an ohmic resistor.

Figure 5:
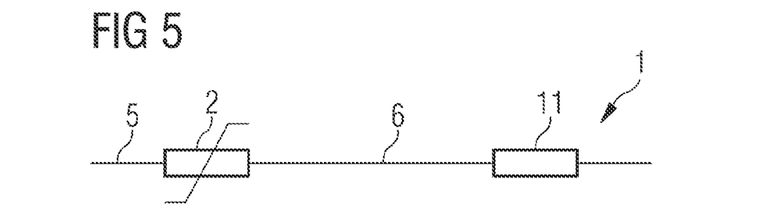
FIG. 5 shows a further embodiment of a component in a schematic circuit diagram.
Figures 15, 16:
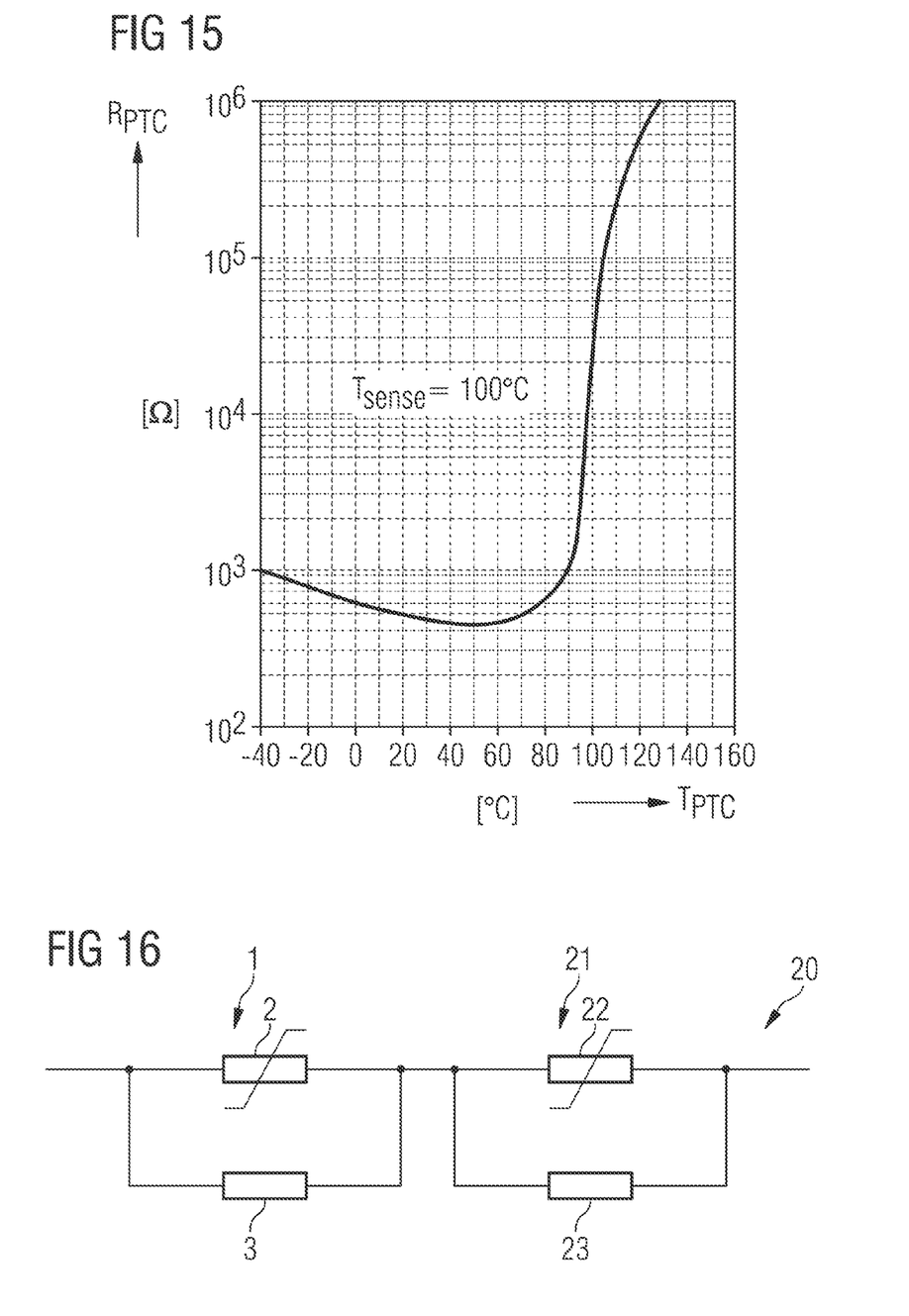
FIG. 15 shows a resistance-temperature characteristic curve of a functional element in a logarithmic representation.
FIG. 16 shows one embodiment of a component arrangement comprising a plurality of components in accordance with FIG. 1.

FIG. 5 shows a schematic circuit diagram of a further embodiment of a component 1 comprising a functional element 2 and a fail safe element 11. The functional element 2 is for example a PTC thermistor, i.e., a PTC element. FIG. 15 shows a resistance-temperature characteristic curve of an exemplary PTC element.

In the case of a short circuit of the functional element 2, the functional element 2 forms only a low or no resistance, and so a high current flow via the functional element 2 can occur. In order to ensure a sufficient resistance of the component 1 even in the case of a short circuit, the fail safe element 11 is interconnected in series with the functional element 2, for example is connected downstream of the functional element 2.

The fail safe element 11 has a low resistance at envisaged operating temperatures. By way of example, temperatures of up to 120° C. are designated as envisaged operating temperature. The envisaged operating temperature can vary depending on the functional element 2 used. The resistance of the fail safe element 11 is significantly lower than the resistance of the functional element 2 for example at an envisaged operating temperature.

By way of example, the fail safe element 11 has a resistance of $R_S=10^2$ ohms. The fail safe element 11 has this resistance for example even at high temperatures, for example at temperatures of greater than 120° C. In the event of a failure of the functional element 2 in the absence of the fail safe element 11 the resistance $R_{tot}$ would be 0 ohms. Owing to the presence of the fail safe element 11, the resistance $R_{tot}$ is $10^2$ ohms. A minimum resistance of the component 1 is thus ensured.

By way of example, the fail safe element 11 is embodied as a PTC thermistor element, in particular as a ceramic PTC element. The PTC thermistor element for example has a low resistance at a customary use temperature of the functional element 2 and has a high resistance at high temperatures. The fail safe element 11 can also have a resistance that is largely constant with respect to temperature. The fail safe element 11 can be formed for example from a wire, in particular as a wire coil or as a suitably dimensioned piece of wire.

Here, too, in addition to the fail safe function, the fail safe element 11 can provide an alarm signal for failure or for damage of the functional element 2 and/or initiate a fault mode for the component 1 or a superordinate system. If the total resistance corresponds to the resistance of the fail safe element 11, this can be interpreted as a signal for the failure of the functional element 2.

Figure 6:
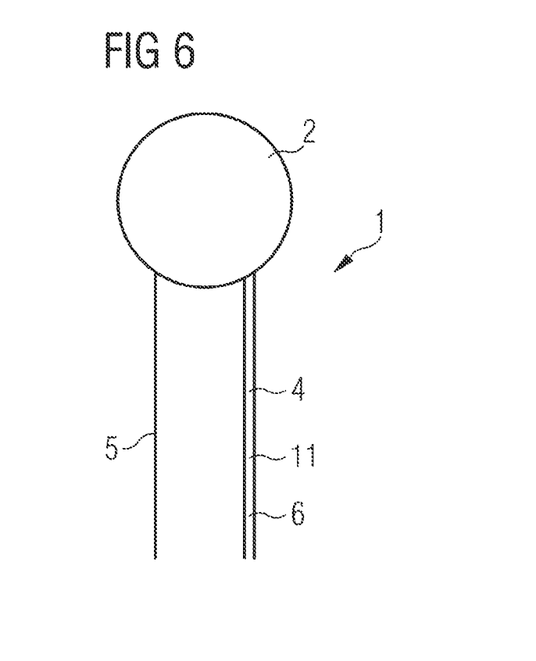
FIG. 6 shows one embodiment of a component in accordance with FIG. 5 in a lateral view.

FIG. 6 shows one embodiment of a component 1 in accordance with FIG. 5 in which a fail safe element 11 is interconnected in series with a functional element 2.

The functional element 2 is for example a disk-type PTC thermistor, which for example comprises a sintered metal oxide and is provided with an exterior metallization. The functional element 2 is electrically contacted via contacting facilities 5, 6. The contacting facilities 5, 6 are embodied, as in FIG. 2, as wires which extend parallel to one another and also carry the functional element 2.

One contacting facility 6 is simultaneously embodied as a fail safe element 11. The fail safe element 11 can also form only part of the contacting facility 6 or be connected as a separate element to the contacting facility 6. The fail safe element 11 is embodied for example as a suitably dimensioned piece of wire 4 or as a separate ohmic resistor. The resistivity of the fail safe element 11 is greater than the resistivity of the other contacting facility 5.

Figure 7:
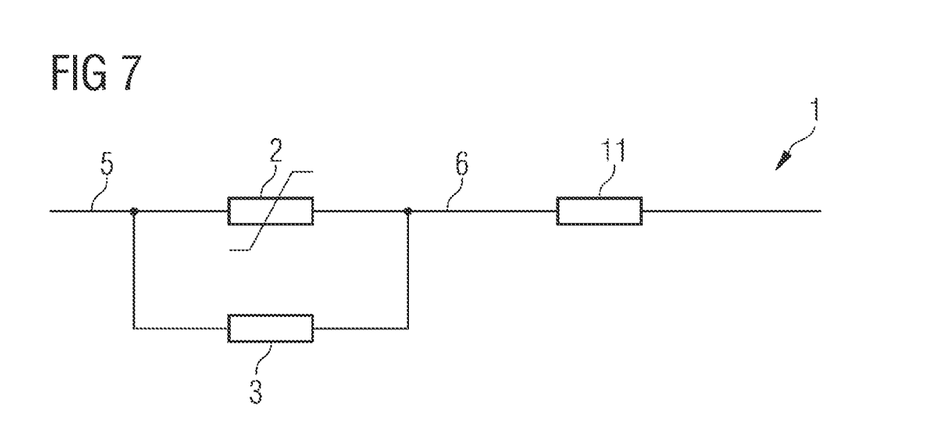
FIG. 7 shows a further embodiment of a component in a schematic circuit diagram.

FIG. 7 shows a schematic circuit diagram of a further component 1 comprising a functional element 2 and two fail safe elements 3, ii, wherein one fail safe element 3 is interconnected in parallel with the functional element 2 and the other fail safe element 11 is interconnected in series with the functional element. This is therefore a combination of the embodiments from FIGS. 1 and 5.

The fail safe element 3 interconnected in parallel ensures that a current flow through the component 1 still occurs in the case of a contact separation of the functional element 2. The fail safe element 11 interconnected in series ensures a minimum resistance of the component 1 in the event of a short circuit of the functional element 2.

By way of example, both fail safe elements 3, ii are embodied as suitably dimensioned pieces of wire or ohmic resistors. In particular, the component 1 can be present as a combination of the embodiments from FIGS. 2 and 6. One or both fail safe elements 3, 11 can also be embodied as PTC thermistor(s).

In addition to the fail safe function, the fail safe elements 3, ii can also provide an alarm signal and/or initiate a fault mode. If the total resistance of the component 1 corresponds to the resistance of the sum of the fail safe elements 3, ii, this can be interpreted as a signal for the failure of the functional element 2.

FIGS. 8 to 14 each show resistance-temperature (R-T) characteristic curves of embodiments in accordance with FIG. 1, wherein a fail safe element 3 is interconnected in parallel with a functional element 2.

Figure 8:
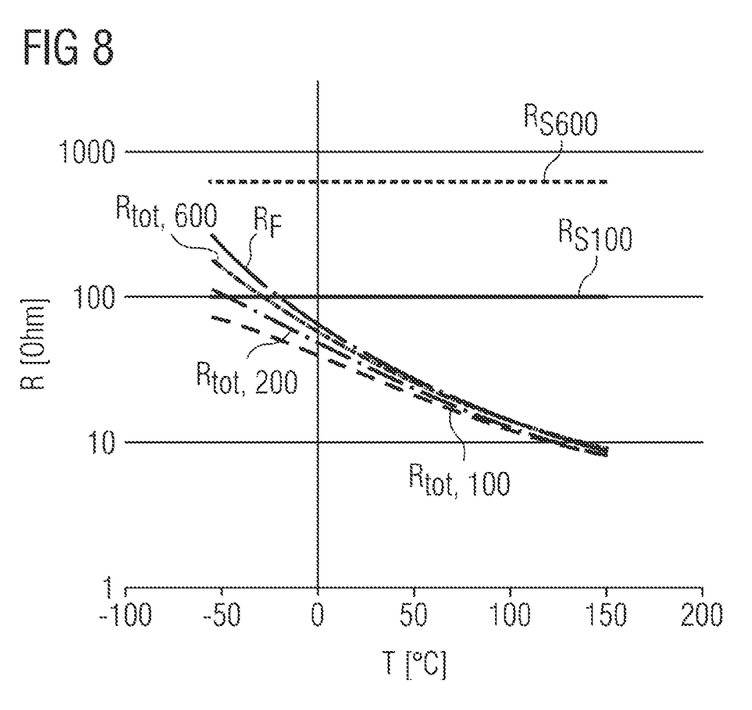
FIGS. 8 to 14 show resistance-temperature characteristic curves of various functional elements, fail safe elements and components in accordance with FIG. 1 in a logarithmic representation or in a linear representation.

FIG. 8 shows R-T characteristic curves of one embodiment in accordance with FIG. 1 in a logarithmic representation. The component 1 is, in particular, an NTC inrush current limiter. A use range of from −55° to 150° C. is represented. The envisaged use range can for example also extend from −40° C. to 150° C. or from −55° C. to 200° C. or from −55° C. to 250° C.

At an operating temperature of 25° C., the functional element 2, i.e., the pure NTC element, has a resistance $R_F=40$ ohms. The resistance of the functional element 2 decreases greatly as the temperature T rises. By way of example, the functional element 2 has a $B_{25/100}$ value of ~3500 K. The $B_{25/100}$ value is a measure of the gradient of the R-T characteristic curve. NTC elements having other B values are also suitable here.

Differently dimensioned fail safe elements 3 are considered. The fail safe elements 3 are embodied as ohmic resistors with values of $R_{S600}=600$ ohms, $R_{S200}=200$ ohms and $R_{S100}=100$ ohms. The subscripted number indicates in each case the resistance of the fail safe element 3 used. The resistance of the respective fail safe element 3 is largely constant in the temperature range under consideration of from −55° C. to 150° C.

At a temperature T=25° C., the resistances of the fail safe elements 3 under consideration are significantly greater than the resistance $R_F$ of the functional element 2. In the present case, the resistances $R_S$ are more than double the magnitude of the resistance of the functional element 2 at 25° C.

The total resistance of the component 1 is denoted by $R_{tot,600}$ and $R_{tot,200}$ and $R_{tot,100}$, respectively, wherein the subscripted number indicates in each case the resistance of the fail safe element 3 used. It is evident that the use of the fail safe elements 3 results in a linearization of the resistance characteristic curve, which here is all the greater, the lower the resistance of the fail safe element 3. By way of example, the fail safe element 3 is chosen in such a way that its resistance at a low temperature is less than the resistance of the functional element 2. In the present case, at a temperature of −25° C., the resistance $R_{S100}$ is lower than the resistance $R_F$ (~410 ohms).

Figure 9:
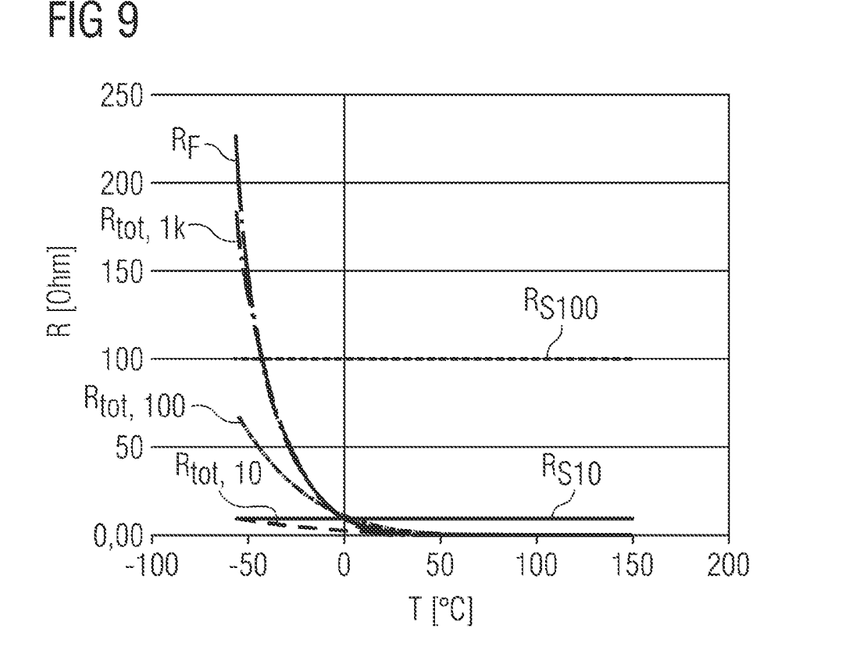
Figure 10:
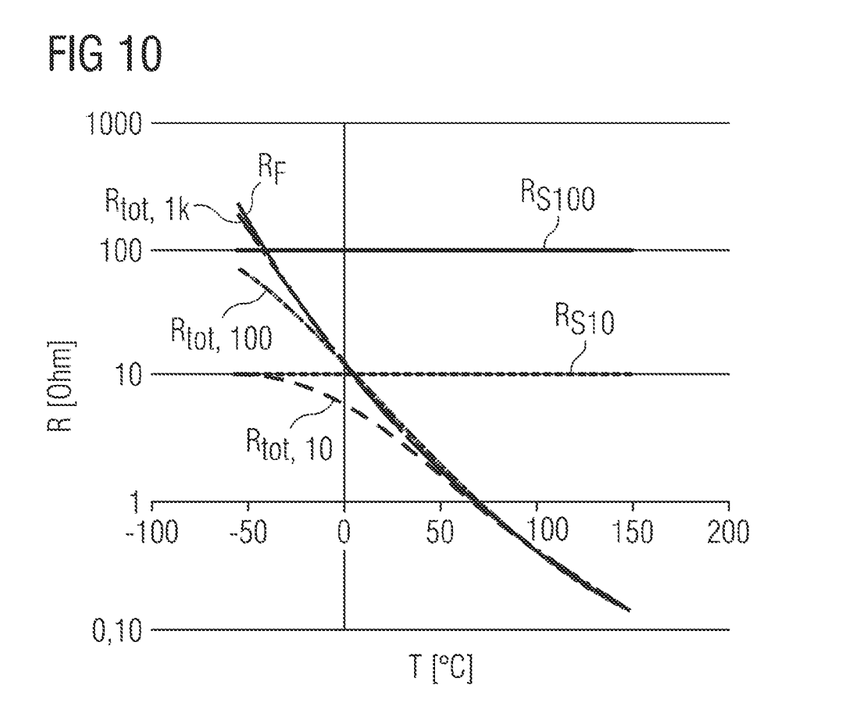

FIGS. 9 and 10 show R-T characteristic curves of further embodiments in accordance with FIG. 1 in a linear and in a logarithmic representation, wherein an NTC element having a resistance $R_F=4.7$ ohms at 25° C. is used as the functional element 2. The $B_{25/100}$ value is 3500 K. Ohmic resistors with values of $R_S=1$ kohm, 100 ohms and 10 ohms are used as fail safe elements 3.

In the present case, at 25° C., the resistances $R_S$ are more than double the magnitude of the resistance $R_F$. At T equals −25° C., the resistance $R_{S10}$ is lower than the resistance $R_F$(~42 ohms); at T=−55° C., the resistances $R_{S10}$ and $R_{S100}$ are lower than the resistance $R_F$ (~228 ohms).

Figure 11:
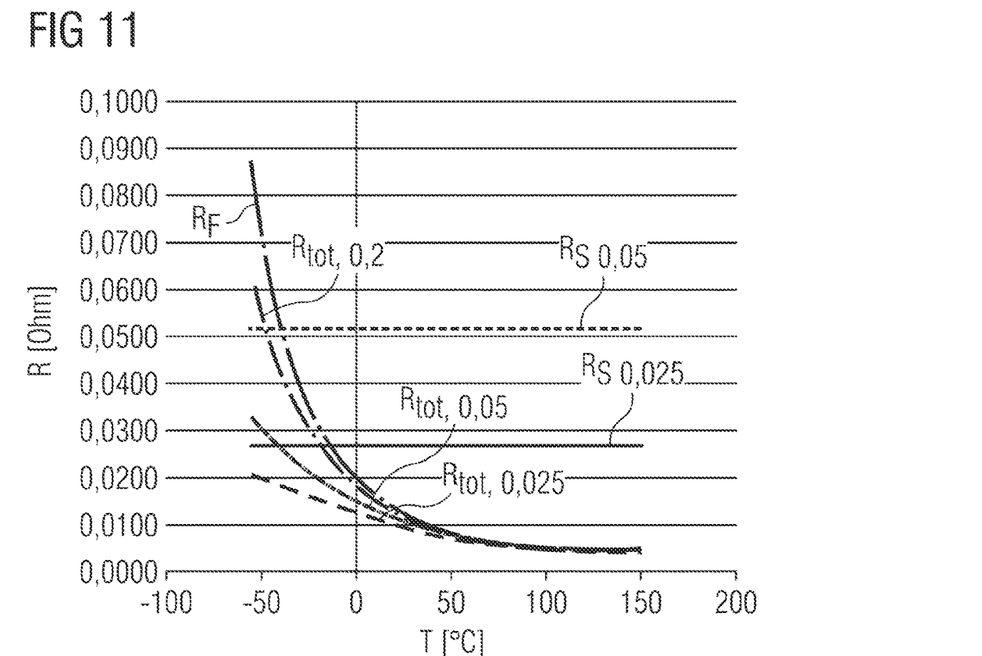
Figure 12:
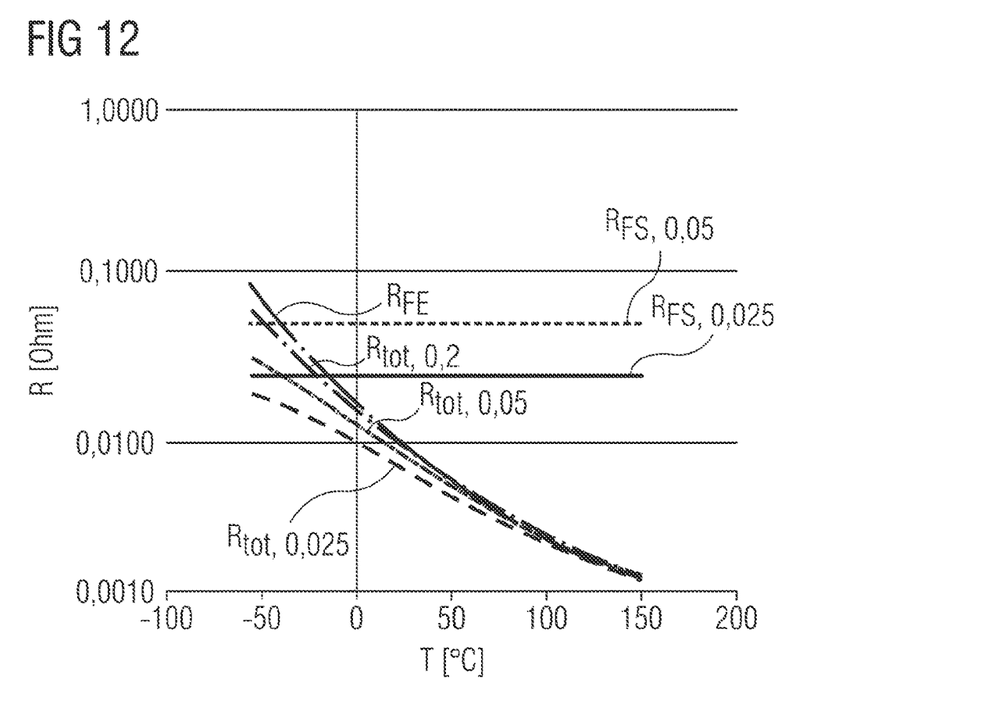

FIGS. 11 and 12 show R-T characteristic curves of further embodiments in accordance with FIG. 1 in a linear and in a logarithmic representation, wherein an NTC element having a resistance $R_F$=0.01 ohm at 25° C. is used as the functional element 2. The $B_{25/100}$ value is 1500 K. Ohmic resistors with values of $R_S$=0.2 ohm, 0.05 ohm and 0.025 ohm are taken into consideration as fail safe elements 3.

Here, too, at 25° C., the resistances $R_S$ are more than double the magnitude of the resistance $R_F$. At T=−25° C., the resistance $R_{S0.025}$ is lower than the resistance $R_F$ (~0.033 ohm); at T=−55° C., the resistances $R_{S0.05}$ and $R_{S0.025}$ are lower than the resistance $R_F$ (~0.086 ohm).

Figure 13:
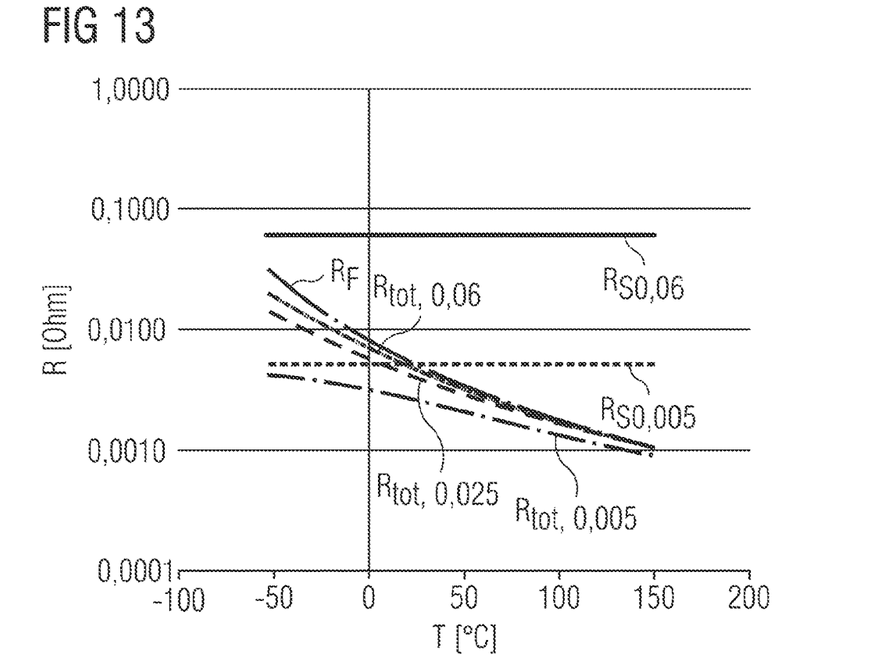

FIG. 13 shows R-T characteristic curves of further embodiments in accordance with FIG. 1 in a logarithmic representation, wherein an NTC element having a resistance $R_F$=0.005 ohm at 25° C. is used as the functional element 2. The $B_{25/100}$ values is 1500 K. Ohmic resistors with values of $R_S$=0.06 ohm, 0.025 ohm and 0.005 ohm are taken into consideration for the fail safe element 2.

Here, at 25° C., the resistances $R_S$ are at least equal to the resistance $R_F$. At T=−25° C., the resistance $R_{S0.005}$ is lower than the resistance $R_F$ (~0.0138 ohm); at T=−55° C., the resistances $R_{S0.025}$ and $R_{S0.005}$ are lower than the resistance $R_F$ (~0.0317 ohm).

A resistance of 0.005 ohm can be achieved for example by means of a cylindrical iron wire having a resistivity of 0.15 ohm mm²/m given a radius of 0.5 mm and a length of 2.5 cm.

Figure 14:
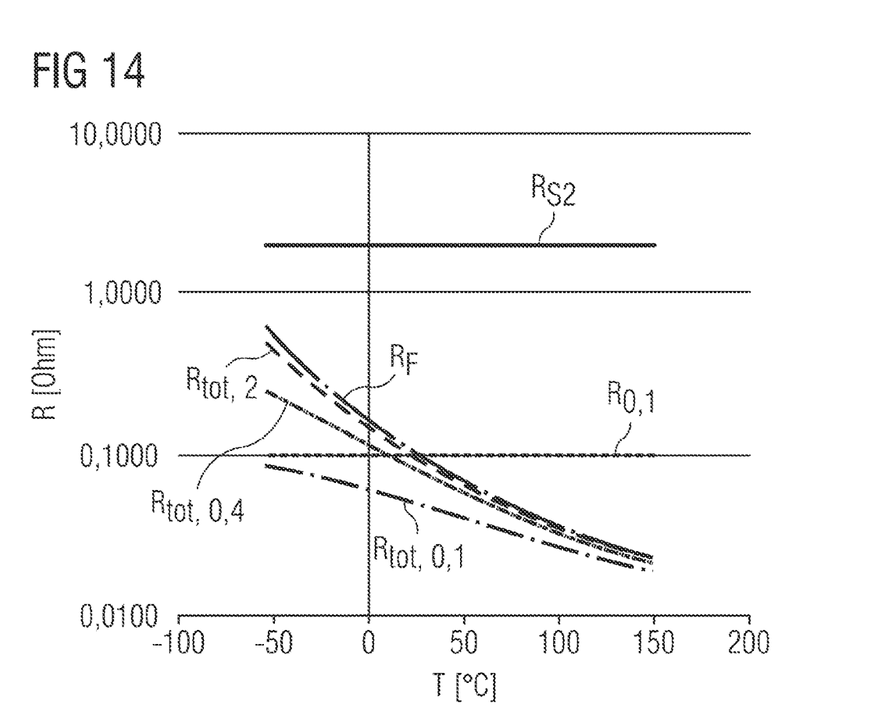

FIG. 14 shows R-T characteristic curves of further embodiments in accordance with FIG. 1 in a logarithmic representation, wherein an NTC element having a resistance $R_F$=0.1 ohm at 25° C. is used as the functional element 2. The $B_{25/100}$ value is 1500 K. Ohmic resistors with values of $R_S$=2 ohms, 0.4 ohm and 0.1 ohm are used for the fail safe element 2.

Here, at 25° C., the resistances $R_S$ are at least equal to the resistance $R_F$. At T=−25° C., the resistance $R_{S0.1}$ is lower than the resistance $R_F$ (~0.28 ohm); at T=−55° C., the resistances $R_{S0.4}$ and $R_{S0.1}$ are lower than the resistance $R_F$ (~0.63 ohm).

FIG. 15 shows an R-T characteristic curve of a functional element 2 embodied as a PTC element, in particular as a PTC thermistor, in a logarithmic representation. The PTC element is suitable for example for an operating temperature around 100° C.

In the temperature range of from −40° C. to 90° C., the resistance of the functional element 2 is approximately 103 ohms. By way of example, an ohmic resistor with a value of $R_S$=$10^5$ ohms is connected in parallel as a fail safe element 3. In this case, the resistance of the component 1 in the range of from −40° C. to 90° C. is approximately 990 ohms.

In the case of significant overheating, for example at a temperature of greater than 120° C., the resistance of the functional element 2 is approximately $10^6$ ohms. The resistance of the component 1 is then approximately 90 kohms.

In the event of a failure of the functional element 2 as a result of contact separation, the resistance of the component 1 is $10^5$ ohms, and so a minimum resistance is ensured.

FIG. 16 shows one embodiment of a component arrangement 20 comprising a plurality of components 1, 21 in accordance with FIG. 1 that are interconnected with one another. The components 1, 21 respectively comprise a functional element 2, 22. By way of example, both functional elements 2, 22 are embodied as PTC temperature sensors. The serial interconnection shown makes it possible to avoid overheating at a plurality of locations. The component arrangement 20 can also be regarded as a component comprising a plurality of fail safe elements 3, 23 and functional elements 2, 22.

A fail safe element 3, 23 is interconnected in parallel with each functional element 2, 22.

By virtue of suitable dimensioning of the functional elements 2, 22 and the fail safe elements 3, 23, a failure of a functional element 2, 22 can be identified by means of a measurement of the total resistance of the component arrangement 20. In particular, it is possible to differentiate between an overheating and a failure of a functional element 2, 22.

The resistances of the fail safe elements 3, 23 differ from one another, for example. By way of example, the first fail safe element 3 has a resistance of $10^4$ ohms and the second fail safe element 23 has a resistance of $10^5$ ohms.

By way of example, both functional elements 2, 22 have the R-T characteristic curve shown in FIG. 15. By measuring the total resistance of the component arrangement 20, it is possible to identify whether and which functional element 2, 22 has failed.

Alternatively, instead of two fail safe elements 3, 23, just one fail safe element 3 can be present, which is interconnected in parallel with both functional elements 2, 22. Then in the event of a failure of one of the functional elements 2, 22 as a result of contact breaking, both functional elements 2, 22 are bridged by the fail safe element 3 and a minimum current is ensured.

The invention claimed is:

1. An electric component comprising:
   a functional element; and
   a fail safe element electrically interconnected therewith,
   wherein the fail safe element is configured to ensure a minimum resistance or a minimum conductivity of the component in an event of a failure of the functional element,
   wherein the fail safe element comprises a carrier for the functional element, and
   wherein the carrier comprises a rod onto which the functional element and contacting facilities of the functional element are pushed such that the rod protrudes out of the functional element at opposite sides of the functional element.

2. The component according to claim 1, wherein the functional element is a PTC thermistor or an NTC thermistor.

3. The component according to claim 1, wherein the functional element is an inrush current limiter or a temperature sensor.

4. The component according to claim 1, wherein the fail safe element is interconnected in parallel with the functional element.

5. The component according to claim 1, wherein the fail safe element is an ohmic resistor.

6. The component according to claim 1, wherein, in case of a parallel interconnection, a resistance of the fail safe element at 25° C. is at least double a magnitude of a resistance of the functional element and, in case of a series interconnection, a resistance of the fail safe element at 25° C. is at most half a magnitude of a resistance of the functional element.

7. The component according to claim 1, wherein at −40° C. a resistance of the fail safe element is less than a resistance of the functional element.

8. The component according to claim 1, wherein the fail safe element is additionally configured to indicate the failure of the functional element.

9. A component arrangement comprising:
at least two components according to claim 1.

10. A method for detecting the failure of the functional element according to claim 1, the method comprising:
measuring a total resistance of the component; and
indicating the failure when the total resistance corresponds to a calculated total resistance in case of the failure of the functional element.

11. An electric component comprising:
a functional element; and
a fail safe element electrically interconnected therewith,
wherein the fail safe element is configured to ensure a minimum resistance or a minimum conductivity of the component in an event of a failure of the functional element,
wherein the fail safe element comprises a housing for the functional element, and
wherein, in case of a parallel interconnection, a resistance of the fail safe element at 25° C. is at least double a magnitude of a resistance of the functional element and, in case of a series interconnection, a resistance of the fail safe element at 25° C. is at most half a magnitude of a resistance of the functional element.

12. The component according to claim 11, wherein the functional element is a PTC thermistor or an NTC thermistor.

13. The component according to claim 11, wherein the functional element is an inrush current limiter or a temperature sensor.

14. The component according to claim 11, wherein the fail safe element is interconnected in parallel with the functional element.

15. The component according to claim 11, wherein the fail safe element is an ohmic resistor.

16. The component according to claim 11, wherein at −40° C. a resistance of the fail safe element is less than a resistance of the functional element.

17. The component according to claim 11, wherein the fail safe element is additionally configured to indicate the failure of the functional element.

18. A component arrangement comprising:
at least two components according to claim 11.

19. A method for detecting the failure of the functional element according to claim 11, the method comprising:
measuring a total resistance of the component; and
indicating the failure when the total resistance corresponds to a calculated total resistance in case of the failure of the functional element.

20. An electric component comprising:
a functional element; and
a fail safe element electrically interconnected therewith,
wherein the fail safe element is configured to ensure a minimum resistance or a minimum conductivity of the component in an event of a failure of the functional element,
wherein the fail safe element comprises a housing for the functional element, and
wherein at −40° C. a resistance of the fail safe element is less than a resistance of the functional element.

* * * * *